United States Patent
McCullough et al.

(10) Patent No.: US 6,561,220 B2
(45) Date of Patent: May 13, 2003

(54) APPARATUS AND METHOD FOR INCREASING THROUGHPUT IN FLUID PROCESSING

(75) Inventors: Kenneth J. McCullough, Fishkill, NY (US); Wayne M. Moreau, Wappingers Falls, NY (US); John P. Simons, Wappingers Falls, NY (US); Charles J. Taft, Wappingers Falls, NY (US); John M. Cotte, New Fairfield, CT (US)

(73) Assignee: International Business Machines, Corp., Armonk, NY (US)

( * ) Notice: Subject to any disclaimer, the term of this patent is extended or adjusted under 35 U.S.C. 154(b) by 102 days.

(21) Appl. No.: 09/840,611

(22) Filed: Apr. 23, 2001

(65) Prior Publication Data

US 2002/0179155 A1 Dec. 5, 2002

(51) Int. Cl.[7] ................................................. F17D 1/04
(52) U.S. Cl. .......................... 137/565.12; 137/565.17; 134/1.3; 118/715
(58) Field of Search ........................... 137/341, 565.12, 137/565.17, 256, 571; 134/88, 90, 1.3; 118/715, 722, 724

(56) References Cited

U.S. PATENT DOCUMENTS

| | | | | |
|---|---|---|---|---|
| 4,971,100 A | * | 11/1990 | Ohmi | 137/13 |
| 5,858,107 A | * | 1/1999 | Chao et al. | 134/1.3 |
| 5,868,856 A | * | 2/1999 | Douglas et al. | 134/1.3 |
| 5,989,345 A | * | 11/1999 | Hatano | 118/715 |
| 6,286,231 B1 | * | 9/2001 | Bergman et al. | 134/1.3 |

FOREIGN PATENT DOCUMENTS

EP        0 706 821 A1    * 4/1996

\* cited by examiner

*Primary Examiner*—John Rivell
(74) *Attorney, Agent, or Firm*—Daniel P. Morris, Esq.; Perman & Green, LLP

(57) ABSTRACT

A method and an apparatus, the apparatus including appropriate valves and conduits, for increasing throughput in pressurized fluid processing including storing in a storage chamber of the apparatus a quantity of fluid at a pressure higher than a pressure at which an operation is to take place, while a processing chamber is depressurized to allow reception of a new object; sealing the processing chamber; and allowing fluid stored in the storage chamber to pass to the processing chamber to re-pressurize the processing chamber before performing the operation. The fluid may be preheated in the storage chamber to further reduce processing times.

9 Claims, 1 Drawing Sheet

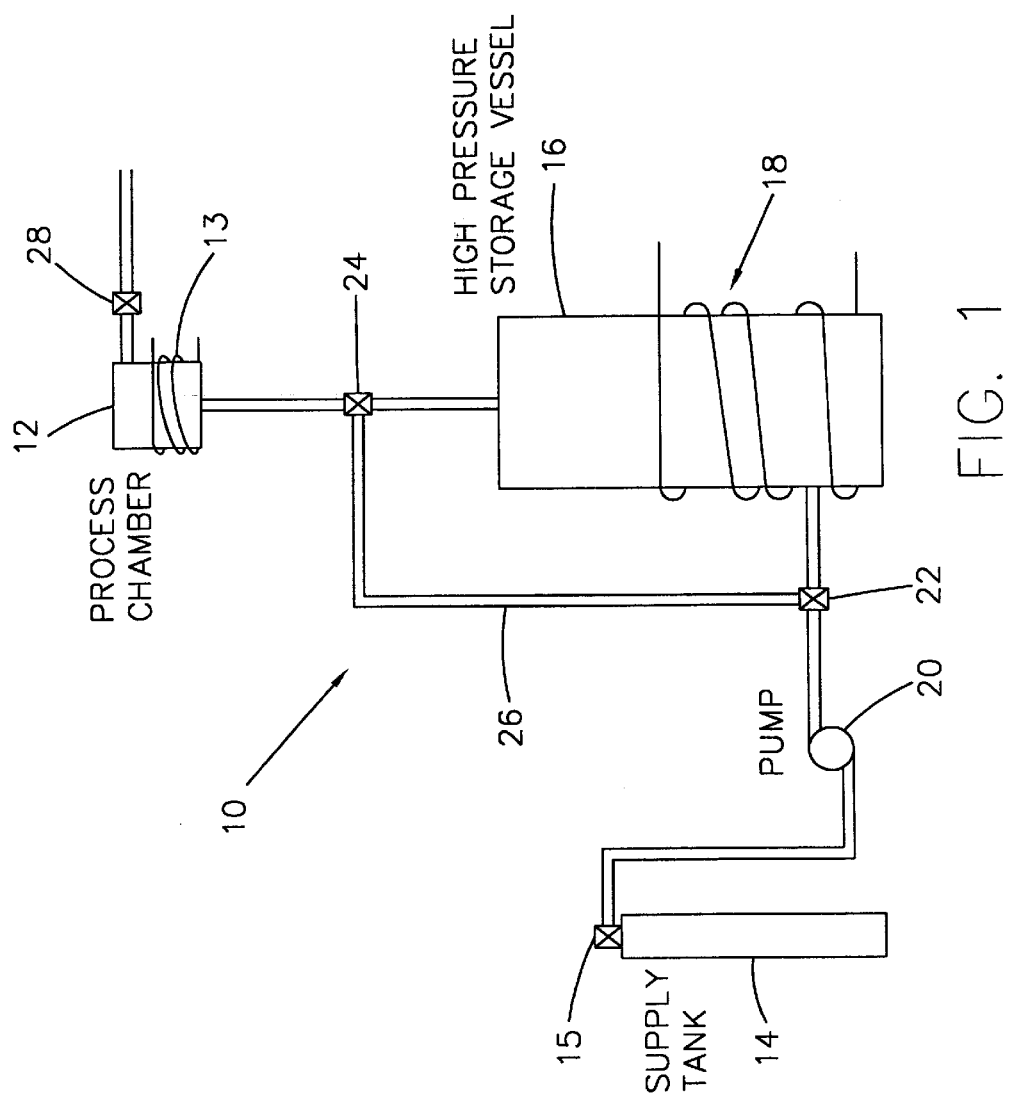

APPARATUS AND METHOD FOR INCREASING THROUGHPUT IN FLUID PROCESSING

BACKGROUND OF THE INVENTION

1. Field of the Invention

The present invention relates to supercritical/high pressure fluid processing. More particularly, it relates an apparatus and method for processing work pieces in a supercritical fluid or high pressure liquid environment in a time efficient manner.

2. Prior Art

In the field of microelectronics, semiconductor products such as integrated circuits often undergo processing (for example cleaning) in a supercritical fluid or high pressure liquid, such as, for example carbon dioxide or a mixture of carbon dioxide and a co-solvent. It is necessary for the fluid to be maintained at a controlled pressure and temperature to optimize the process.

Processing of work pieces occurs in a high pressure processing chamber, which must be loaded with the work pieces. One of the major inhibitors to incorporating supercritical fluid or high pressure liquid processing into manufacturing is the low throughput due to long cycle times necessary to pressurize and depressurize the chamber in order to load and discharge the work pieces. Currently, in order to process workpieces in a supercritical fluid (SCF)/high pressure liquid tool, the workpieces must be loaded into the process chamber at ambient temperature and pressure, the tool sealed and then the system must be pressurized by purging the atmospheric air with high pressure fluid which will be brought up to critical processing pressures by pumping on the entire system.

SUMMARY OF THE INVENTION

It is an object of the invention to provide a method and an apparatus for increasing throughput in high pressure fluid processing operations.

The invention is directed to a method for operating a system having a processing chamber for performing an operation at high pressures on an object placed in the chamber. The method comprises storing in a storage chamber a quantity of the fluid at a pressure higher than a pressure at which the operation is to take place, while the processing chamber is depressurized to allow reception of a new object; sealing the processing chamber; and allowing fluid stored in the storage chamber to pass to said processing chamber to re-pressurize the processing chamber before performing the operation. The method may further comprise selecting a pressure to which the storage vessel is pressurized based on relative sizes of the storage vessel and the processing chamber.

The method may further comprise purging the process chamber with the fluid before re-pressurizing the processing chamber. It may also further comprise venting the processing chamber after the operation is performed.

The invention is also directed to an apparatus for processing an object with fluid from a fluid source at high pressure. The apparatus comprises a storage vessel for storing a quantity of the fluid supplied from the fluid source; a pump for pumping the fluid from the fluid source to the storage vessel, the pump having an input connected to the fluid source and an output connected to the storage vessel; a processing chamber in which objects to be processed are placed for processing and from which the objects are removed after processing; a first valve between the pump and the storage vessel; a second valve between the storage vessel and the processing chamber; and an exhaust valve associated with the processing chamber to permit the processing chamber to be vented.

The apparatus may further comprises a bypass for bypassing fluid from the output of the pump to the processing chamber.

The first valve may be a two way valve having an input, a first output and a second output, the input being connected to the output of the pump, and a first output connected to the storage vessel, and the second valve may be a two way valve having an output, a first input and a second input, the first input being connected to the storage vessel, and the output connected to the processing chamber; further comprising a bypass connection between the second output of the first valve and the second input of the second valve. In general, the storage vessel has a larger volume than the processing chamber. The storage vessel is pressurized to a higher pressure than the processing chamber. The storage vessel and the processing chamber are relatively sized, and the processing chamber is pressurized, so that when the second valve is opened and pressure equilibrates between the storage vessel and the processing chamber, the processing chamber is at an operating pressure for performing operations on the objects. The fluid source for the apparatus may be a pressured fluid cylinder or a fluid generator. The apparatus may further comprise a heater for heating fluid stored in the storage vessel and a heater for heating fluid in the processing chamber. The pump may be an air driven liquid pump.

The fluid may be a supercritical fluid, such as supercritical carbon dioxide and may include a co-solvent. Operations may be performed at a pressure of between approximately 700 and 6000 psi (48 to 408 atmospheres).

BRIEF DESCRIPTION OF THE DRAWING

The foregoing aspects and other features of the present invention are explained in the following description, taken in connection with the accompanying drawings, wherein:

FIG. 1 is a schematic diagram of a system in accordance with the invention.

DETAILED DESCRIPTION OF THE PREFERRED EMBODIMENT

Referring to FIG. 1, there is shown a schematic diagram of a system 10 incorporating features of the present invention. Although the present invention will be described with reference to the single embodiment shown in the drawings, it should be understood that the present invention can be embodied in many alternate forms of embodiments. In addition, any suitable size, shape or type of elements or materials could be used.

In accordance with the invention, a processing chamber 12 of a conventional type such as a reactor bomb manufactured by PARR Instruments of Moline, Ill., may be provided. If the processing fluid is carbon dioxide, it will be supercritical at a pressure of at least 1070 psi (72.8 atmospheres) and a temperature of 31 degrees Celsius. Typical processing pressures may be in the range of approximately 1100 psi to 6000 psi (75 to 408 atmospheres), but may be kept at the center of this range, that is preferably at 3000 psi (204 atmospheres). Other applications may dictate liquid phase processing normally in the range of 800 to 100 psi (54 to 68 atm.).

A heater 13 may be provided to supply heat to chamber 12 to keep it at a required processing temperature. Alternatively, or in addition, the fluid used in chamber 12 may be preheated externally to chamber 12 before being introduced therein, as more fully described below.

System 10 is supplied with fluid from a conventional pressurized fluid source 14, valved by a conventional valve 15, such as a pressurized cylinder of a type commercially available and well known in the art. Other sources can be used, depending on the type of fluid. For example, for certain fluids, a fluid generator, which produces the fluid continuously, may be used.

In accordance with the invention, a storage chamber or vessel 16 is provided to store a quantity of the fluid that is being used to process the work pieces. It is preferred that vessel 16 have a volume which is greater than that of chamber 12, and that it be capable of pressurization to a higher pressure. For example if chamber 12 has a volume of 1 liter, then vessel 16 may have a volume of 3 liters. Vessel 16 may also have associated therewith a heater 18 to heat the fluid stored therein. Heater 18 is shown as an electrical coil heater, but it will be understood that other sources of heat can be used, such as, for example, a combustion heater, or a radiative heat source. This has the advantage of contributing to a substantial reduction in cycle times, as explained below.

Fluid in fluid source 14 is transferred to storage vessel 16 by way of a pump 20 and a valve 22. Pump 20 may be any of several well know pumps having an appropriate capacity and pressure output rating, such as an air driven liquid pump manufactured by Haskel International, Inc. of Burbank, Calif. Pump 20 may operate virtually continuously in order to perform the functions as set forth below.

Valve 22 is preferably a switching valve having one input and two outputs, with flow directed from the input to one of the two outputs, depending on the position of a control handle thereof (not shown). The input of valve 22 is connected to the output of pump 20. A first output of valve 22 is connected to a port of storage vessel 16. A second output of valve 22 is connected to an input of a second valve 24 by way of a bypass conduit 26. Valve 24 may be of the same construction as valve 22, but is utilized so that it has two inputs and one output. A first input of valve 24 is connected to a second port of storage vessel 16. The output of valve 24 is connected to a fluid input port of processing chamber 12. The second input of valve 24 is connected to bypass conduit 26, as discussed above.

Processing chamber 12 is also connected to a venting valve 28 which may be used to vent processing chamber 12.

Operation of the system will be described below with specific reference to lines in the Operations Table set forth below. It will be understood that operations may be conducted manually by an operator, or automatically by a suitably configured automated system, or by some combination of both. For example, suitable pressure gauges and temperature measuring devices may be employed to assure that certain operation steps do not go forward until the proper conditions exist.

At the start of operations, processing chamber 12 is disassembled or otherwise brought to atmospheric pressure and samples to be processed are loaded therein. It is then reassembled in a pressure tight manner. In accordance with step 1 in the Operation Table, valve 28 is opened. Valve 22 is set so that fluid may flow from pump 20 to bypass conduit 26. Valve 24 is set so that fluid may flow from bypass conduit 26 into processing chamber 12. Thus, processing chamber 12 is purged of atmospheric gases by the flow of fluid from fluid source 14.

In accordance with line 2 in the Operations Table, after purging, at line 2, valve 28 is closed. Valve 22 is set so the output of pump 20 is directed into storage vessel 16. Valve 24 remains in its previous position so that the output thereof is connected to bypass conduit 26. The combination of these valve settings effectively isolates processing chamber 12. It also effectively seals the output port of storage vessel 16.

While processing chamber 12 comes up to temperature, as a result of heating by heater 13, pump 20 builds up pressure of fluid in storage vessel 16 by continuously pumping fluid into vessel 16. After a predetermined pressure has been reached, by waiting a predetermined period of time, or by monitoring the pressure with a pressure gauge, and processing chamber 12 is at the appropriate temperature for processing to occur, the position of valve 24 is changed (line 3 in the Operations Table), thus allowing the pressures in processing chamber 12 and storage vessel 16 to equilibrate, as fluid flows from storage vessel 16 into processing chamber 12. As long as the pressure in vessel 16 is high enough, and its volume sufficiently large, processing chamber 12 will be filled by the processing fluid to a pressure at which operations in processing chamber 12 can be conducted on work pieces placed therein.

As soon as the pressures in processing chamber 12 and storage vessel 16 have come to equilibrium, the position of valve 24 is shifted, thus isolating processing chamber 12 (line 4 in the Operations Table). However, pump 20 continues to operate, thus increasing the amount and pressure of fluid in storage vessel 16. The temperature of this fluid is increased appropriately, due to the increasing pressure, and by means of heater 18, for performing the desired operation on a work piece by means of heater 18.

When the operation performed on the work pieces in processing chamber 12 are complete, valve 28 is opened, thus venting the processing fluid (line 5 in the Operations Table). It will be understood that the vented fluid may be recovered and recycled for further use by suitable means that do not constitute a part of this invention.

Processing chamber 12 is then disassembled (line 6 in the Operations Table), and the work pieces removed therefrom. New work pieces are loaded into processing chamber 12. Processing chamber 12 is then again sealed in a pressure tight manner. The position of valve 22 is changed to connect pump 20 to bypass conduit 26. Venting valve 28 remains open. Valve 24 is positioned so that bypass conduit 26 is in communication with processing chamber 12, thus purging processing chamber 12 (line 7 in the Operations Table, which is equivalent to line 1). As soon as this is accomplished, valve 28 is closed. The position of valve 22 is changed so that the output of pump 20 is again directed into storage vessel 16. As soon thereafter as processing chamber 12 is close to its intended operating pressure, the position of valve 24 is changed. In a matter of seconds, the pressure in storage vessel 16 and processing chamber 12 come to equilibrium, and the desired operation can be performed on work pieces in processing chamber 12. Thus, in sharp contrast to prior systems, it is not necessary for pump 20 to begin the long process of directly pressurizing processing chamber 12. Instead processing chamber 12 is quickly pressurized by a portion of the fluid previously stored and heated in storage vessel 12.

The process described above, including venting, changing the work piece, and repressurizing, can be repeated any number of times, with time savings occurring during all subsequent cycles. In other words steps 2–7 in the Operations table are repeated over and over again until all work pieces have been processed. Thus, the time savings achieved is multiplied by the number of cycles. When all items have been processed and it is time to shut down the system, or when it must be shut down for maintenance or repair, operations are terminated by repeating steps 2–5.

| Operations Table | | | |
|---|---|---|---|
| Step | Valve 22 Position | Valve 24 Position | Valve 28 Position |
| 1) Purge | To Bypass 26 | Bypass to Chamber 12 | Open |
| 2) Initial System Pressurization | To Storage Vessel | Bypass to Chamber 12 | Closed |
| 3) Pressurize Processing Chamber | To Storage Vessel | Storage Vessel to Processing Chamber | Closed |
| 4) When equilibrium is achieved (processing) | To Storage Vessel | Bypass to Chamber 12 | Closed |
| 5) Vent | To Storage Vessel | Bypass to Chamber 12 | Open |
| 6) Disassemble reload and, pressurize storage vessel | To Storage Vessel | Bypass to Chamber 12 | Open |
| 7) Purge | See (1) above | | |
| 8) Repeat steps 2–7 as many times as required to process all items in processing chamber 12 | | | |
| 9) To terminate Operations Perform Steps 2–5 then Shut Down | | | |

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. An apparatus for processing an object with a fluid at high pressure, the fluid being from a fluid source, the apparatus comprising:
    a storage vessel for storing a quantity of the fluid supplied from the fluid source;
    a pump for pumping the fluid from the fluid source to the storage vessel, said pump having an input connected to said fluid source and an output connected to said storage vessel;
    a processing chamber in which objects to be processed are placed for processing and from which the objects are removed after processing;
    a first valve between the pump and the storage vessel;
    a second valve between the storage vessel and the processing chamber;
    an exhaust valve associated with the processing chamber to permit the processing chamber to be vented;
    wherein said first valve is a two way valve having an input, a first output and a second output, said input being connected to the output of said pump, and a first output connected to said storage vessel;
    said second valve is a two way valve having an output, a first input and a second input, said first input being connected to the storage vessel, said output connected to said processing chamber; and
    further comprising a bypass connection between said second output of said first valve and said second input of said second valve.

2. The apparatus of claim 1, further comprising a bypass for bypassing fluid from said output of said pump to said processing chamber.

3. The apparatus of claim 1, wherein said storage vessel has a larger volume than said processing chamber.

4. The apparatus of claim 1, wherein said storage vessel is pressurized to a higher pressure than said processing chamber.

5. The apparatus of claim 1, wherein said storage vessel and said processing chamber are relatively sized, and said processing chamber is pressurized, so that when said second valve is opened and pressure equilibrates between said storage vessel and said processing chamber, said processing chamber is at an operating pressure for performing operations on said objects.

6. The apparatus of claim 1, wherein said fluid source is one of a pressured fluid cylinder and a fluid generator.

7. The apparatus of claim 1, further comprising a heater for heating fluid stored in said storage vessel.

8. The apparatus of claim 1, further comprising a heater for heating fluid in said processing chamber.

9. The apparatus of claim 1, wherein said pump is an air driven liquid pump.

* * * * *